(12) United States Patent
Snowdon et al.

(10) Patent No.: US 9,224,566 B2
(45) Date of Patent: Dec. 29, 2015

(54) FUSE DRIVER CIRCUITS

(75) Inventors: Kenneth P. Snowdon, Cumberland, ME (US); William Robert Newberry, Cumberland, ME (US); James Hall, Cumberland, ME (US); Roy Yarbrough, Cumberland, ME (US)

(73) Assignee: Fairchild Semiconductor Coporation, San Jose, CA (US)

( * ) Notice: Subject to any disclaimer, the term of this patent is extended or adjusted under 35 U.S.C. 154(b) by 699 days.

(21) Appl. No.: 12/965,611

(22) Filed: Dec. 10, 2010

(65) Prior Publication Data
US 2011/0140713 A1 Jun. 16, 2011

Related U.S. Application Data

(60) Provisional application No. 61/285,828, filed on Dec. 11, 2009.

(51) Int. Cl.
*H01H 37/76* (2006.01)
*H01H 85/46* (2006.01)
*G01R 31/07* (2006.01)

(52) U.S. Cl.
CPC ............... *H01H 85/46* (2013.01); *G01R 31/07* (2013.01); *H01H 2085/466* (2013.01)

(58) Field of Classification Search
USPC .................................................. 327/525, 537
See application file for complete search history.

(56) References Cited

U.S. PATENT DOCUMENTS

| | | | | |
|---|---|---|---|---|
| 5,208,492 A * | 5/1993 | Masumoto et al. | ............. | 326/87 |
| 5,428,311 A * | 6/1995 | McClure | ....................... | 327/276 |
| 5,585,759 A * | 12/1996 | Lee | .................. | H03K 19/00361 |
| | | | | 327/404 |
| 5,838,146 A * | 11/1998 | Singer | ........................... | 323/270 |
| 6,037,799 A * | 3/2000 | McClure | ................ | G11C 29/24 |
| | | | | 326/37 |
| 6,483,373 B1 * | 11/2002 | Lim | ...................... | G11C 7/1045 |
| | | | | 327/525 |
| 6,489,832 B1 * | 12/2002 | Kim | ....................... | G11C 17/16 |
| | | | | 327/525 |
| 7,027,276 B2 * | 4/2006 | Chen | ...................... | H02H 9/046 |
| | | | | 361/56 |
| 7,057,441 B2 * | 6/2006 | Yoon | ............................. | 327/526 |
| 7,271,989 B2 * | 9/2007 | Huang et al. | .................. | 361/91.1 |
| 7,459,350 B2 * | 12/2008 | Hsieh | ............................ | 438/132 |
| 2003/0107928 A1 * | 6/2003 | Sakata | .......................... | 365/200 |
| 2004/0207455 A1 * | 10/2004 | Kimura | ......................... | 327/525 |
| 2007/0002660 A1 * | 1/2007 | Hsieh | ............................ | 365/225.7 |
| 2007/0139843 A1 * | 6/2007 | Lin et al. | ........................ | 361/104 |
| 2008/0055959 A1 * | 3/2008 | Luich et al. | ..................... | 365/96 |
| 2008/0106952 A1 * | 5/2008 | Seo et al. | ................. | 365/189.05 |
| 2008/0244004 A1 * | 10/2008 | Philyaw | ........................ | 709/203 |
| 2009/0197156 A1 * | 8/2009 | Goto | ............................... | 429/93 |
| 2010/0246076 A1 * | 9/2010 | Campi et al. | ..................... | 361/56 |

OTHER PUBLICATIONS

FSA 9280A/FSA 9288A USB Port Multimedia Switch Featuring Automatic Select and Accessory Detection Brochure; dated Sep. 2010.

* cited by examiner

*Primary Examiner* — Lincoln Donovan
*Assistant Examiner* — Patrick Chen
(74) *Attorney, Agent, or Firm* — Kenneth E. Horton; Kirton McConkie (57) ABSTRACT

Fuse driver circuits, fuse driver testing circuitry, and methods for testing the fuse driver circuits using the testing circuitry are described. In some embodiments, the fuse driver circuit can be made using a fuse, a NMOS transistor, and a PMOS transistor. The drain of the NMOS transistor can be connected to the negative end of the fuse. The source of the NMOS transistor can be connected to ground. The drain of the PMOS transistor can be connected to a positive end of the fuse. The NMOS and PMOS transistors provide enhanced robustness to the fuse driver circuit in both undervoltage and overvoltage conditions. Other embodiments are also described.

21 Claims, 6 Drawing Sheets

FUSE DRIVER CIRCUITS

CROSS-REFERENCE TO RELATED APPLICATION

This patent application claims priority of U.S. Provisional Application Ser. No. 61/285,828, filed on Dec. 11, 2009, the entire disclosure of which is hereby incorporated by reference.

FIELD

This application relates generally to electric circuits. More specifically, this application relates to fuse driver circuits, fuse driver testing circuitry, and methods for testing the fuse driver circuits using the testing circuitry.

BACKGROUND

Polysilicon fuses (or "polyfuses") are used in semiconductor devices or packages due to their ability to be blown without an opening, which otherwise allows fused by-products to escape. Polysilicon fuses can thus be used for trimming during wafer sorting, final testing, and in other customer applications. Like traditional fuses, polyfuses can be affected by the high currents of electrostatic discharge (ESD) and electrical overstress (EOS) events.

In semiconductor circuit applications, polyfuses may be harmed by both undervoltage and overvoltage events. Generally, polyfuses have a polysilicon layer and a silicide layer on all or part of the top of the polysilicon layer. In an ESD event, high current flows through the polyfuse, increasing its temperature and melting the silicide and/or polysilicon, which can disable or blow the fuse. Additionally, the polyfuse may be rendered useless by current levels that do not blow the fuse, but merely increase the resistance of the fuse silicide. In these events, the intended drive circuit supplies sufficient current to heat and melt the silicide and polysilicon layers and blow the fuse, thus rendering the polyfuse useless.

SUMMARY

This application describes fuse driver circuits, fuse driver testing circuitry, and methods for testing the fuse driver circuits using the testing circuitry. Some embodiments of the invention can be configured as follows. The fuse driver circuit can be made using a fuse, a NMOS transistor, and a PMOS transistor. The drain of the NMOS transistor can be connected to the negative end of the fuse. The source of the NMOS transistor can be connected to ground. The drain of the PMOS transistor can be connected to a positive end of the fuse. The NMOS and PMOS transistors provide enhanced robustness to the fuse driver circuit in both undervoltage and overvoltage conditions.

BRIEF DESCRIPTION OF THE DRAWINGS

The following description can be better understood in light of the Figures, in which.

The Figures illustrate specific aspects of the fuse driver circuits, testing circuitry containing the same, and methods for testing the fuse driver circuit. Together with the following description, the Figures demonstrate and explain the principles of the structure and methods of this circuitry. The same reference numerals in different drawings represent the same element, and thus their descriptions will not be repeated.

DETAILED DESCRIPTION

The following description supplies specific details in order to provide a thorough understanding. Nevertheless, the skilled artisan would understand the circuit operation and methods for making and using such circuits can be implemented and used without employing all of the described details. Indeed, the devices and associated methods can be placed into practice by modifying the illustrated devices and associated methods and can be used in conjunction with any other apparatus and techniques conventionally used in the industry.

Figure 1:
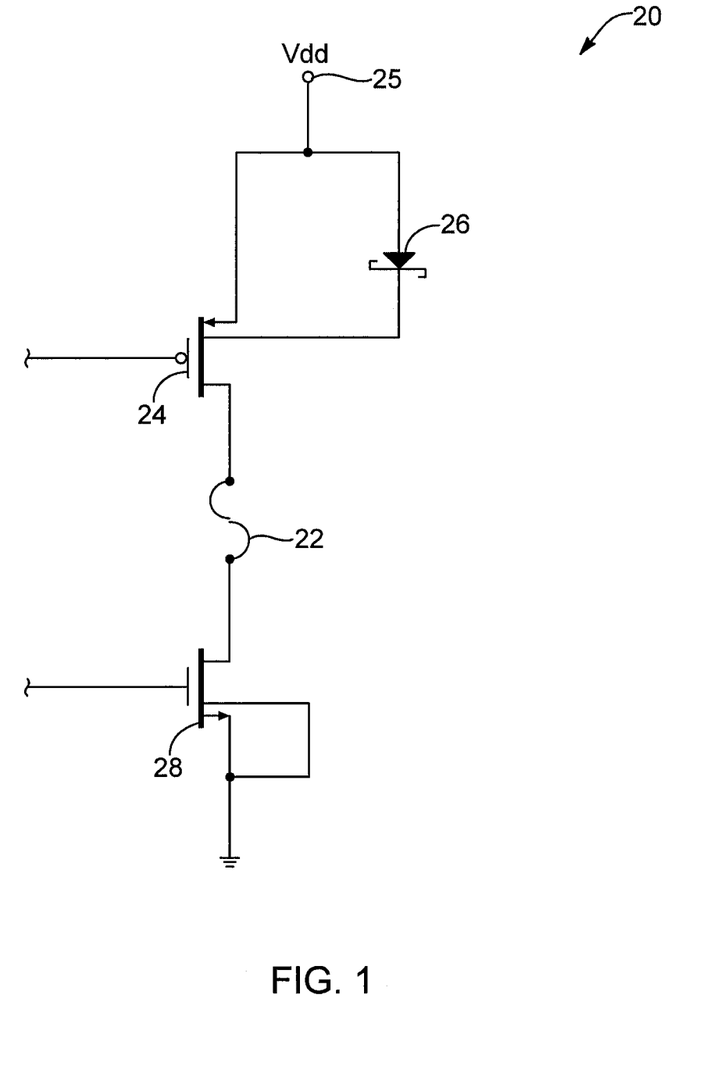
FIG. 1 depicts some embodiments of a fuse driver circuit.

FIGS. 1-6C depict some embodiments of fuse driver circuits, fuse driver testing circuitry, and methods for testing the fuse driver circuits using the testing circuitry. In these embodiments, as depicted in FIG. 1, a fuse driver circuit 20 can be provided with a fuse 22. Generally, the circuitry of a fuse driver circuit controls or limits the current passing through the fuse 22. In some embodiments, the fuse driver circuit controls or limits the current in order to control the required conditions for blowing the fuse 22.

In some embodiments, the fuse 22 can contain one or more polyfuse(s). Any known variety of polyfuse can be used in the circuit 20, such as a pinched polyfuse, silicided polyfuse, silicided gap fuse, polysilicon fuse, or combinations thereof. The fuse 22 can include a positive and a negative end with the negative end of the fuse 22 being (electronically) coupled to the drain of an n-channel metal-oxide semiconductor (NMOS) transistor 28, as shown in FIG. 1. The source of the NMOS transistor 28 can be coupled to ground. The bulk of the NMOS transistor can also be coupled to ground.

In some configurations, the NMOS transistor 28 can be referred to as a pull-down NMOS transistor 28. The pull-down NMOS transistor 28 protects the fuse 22 when the power supply voltage (Vdd) 25, which is generally positive in relation to ground, substantially increases and causes an overvoltage event. In an overvoltage event, the pull-down NMOS transistor 28 breaks down and draws the current through the fuse 22. The pull-down NMOS transistor 28 can break down when the power supply voltage exceeds a certain threshold. Thus, the pull-down NMOS transistor 28 can protect the fuse 22 from power supply voltages below that certain threshold, which can be a pre-designated voltage threshold or natural voltage threshold.

The pull-down NMOS transistor 28 can also protect the fuse 22 when some undervoltage events occur. In undervoltage events, the power supply voltage drops below ground, which can forward bias the pull-down NMOS transistor 28 and allow the current to flow through the fuse 22. In such instances, the pull-down NMOS transistor 28 can function like a P-N diode where current flows from the P-doped substrate to the N-doped drain of the pull-down NMOS transistor 28. When the drain is pulled negatively, the pull-down NMOS transistor 28 can become forward biased and current flows through the pull-down NMOS transistor 28 to the fuse 22. Thus, in undervoltage conditions, the current flowing through the fuse 22 can be of a significantly lower magnitude than it would otherwise be if the pull-down NMOS transistor 28 was not present. In some configurations, especially where a diode is used in series with the fuse 22, the circuitry 20 therefore provides a useful function to limit the current in an undervoltage event.

In the embodiments shown in FIG. 1, in addition to—or in place of—having a pull-down NMOS transistor 28, the circuit 20 can contain a p-channel metal-oxide semiconductor (PMOS) transistor 24. The positive end of the fuse 22 can be coupled to the drain of a PMOS transistor 24. The source of the PMOS transistor 24 can be coupled to a power supply voltage (Vdd) 25. The bulk of the PMOS transistor 24 can be coupled to ground.

In some embodiments, this PMOS transistor can be referred to as a pull-up PMOS transistor 24. The pull-up PMOS transistor 24 can provide undervoltage and/or overvoltage protection to the fuse 22. In an overvoltage event, similar to the pull-down NMOS transistor 28, the pull-up PMOS transistor 24 can protect the fuse 22 from overvoltage events where the voltage falls below a preconfigured voltage threshold. Also, similar to the pull-down NMOS transistor 28, the PMOS transistor 24 can break down and allow the current to flow through the fuse 22 after the power supply voltage (Vdd) 25 exceeds the pull-up PMOS transistor's 24 voltage threshold. Accordingly, by configuring the PMOS transistor 28 to have a predetermined voltage threshold, the circuit 20 can prevent blowing of the fuse 22 in overvoltage events below the voltage threshold, while also allowing the fuse 22 to blow in overvoltage events above the voltage threshold.

In some embodiments, the pull-up PMOS transistor 24 can reduce the current delivered to the fuse 22 in undervoltage events. In an undervoltage event, without a pull-up PMOS transistor 24 a current of, for example, several milliamperes might pass through the fuse 22. But, by including a pull-up PMOS transistor 24 in the circuit 20, a current of only several nanoamperes could pass through the fuse 22. And, in another example, if the power source (Vdd) 25 is swept from a minimum operating value of Vdd (e.g., −10 volts) to a maximum operating value of Vdd (e.g., 25 volts) between which the fuse 22 is not intended to blow, the pull-up PMOS transistor 24 could limit the current flow through the fuse 22 to less than a microampere, thus protecting the fuse 22 from damaging current levels. In some embodiments, the maximum voltage is 40 volts, and the minimum voltage is 15 volts. In other embodiments, the maximum voltage is 10 volts and the minimum voltage is 5 volts. These maximum and minimum voltages are not intended to limit the invention, but only provide representative voltage values. In some embodiments, a current level of over four milliamperes of current would be required to damage the fuse 22. In this way, the pull-up 24 and pull-down 28 transistors may add robustness to the fuse circuit 20.

In some embodiments, the combination of a pull-up transistor 24 and a pull-down transistor 28 can increase the breakdown point of the two transistors such that the combination protects the fuse 22 from high voltage levels. For example, the pull-down NMOS transistor 28 can break down when the power supply voltage exceeds 12 volts. However, when combined with a pull-up PMOS transistor 24, the two transistors together could produce a combined break down voltage of 20 volts. Accordingly, the combination of the pull-up and pull-down transistors 24 and 28 increase the robustness of the fuse driver circuit 20 by increasing the voltage threshold required for an overvoltage event to create current flow through the fuse 22. The pull-down transistor 28 and the pull-up transistor 24 can be configured to have a predetermined combined breakdown voltage that is designed for blowing the fuse 22 in an overvoltage event.

Figures 6A, 6B:
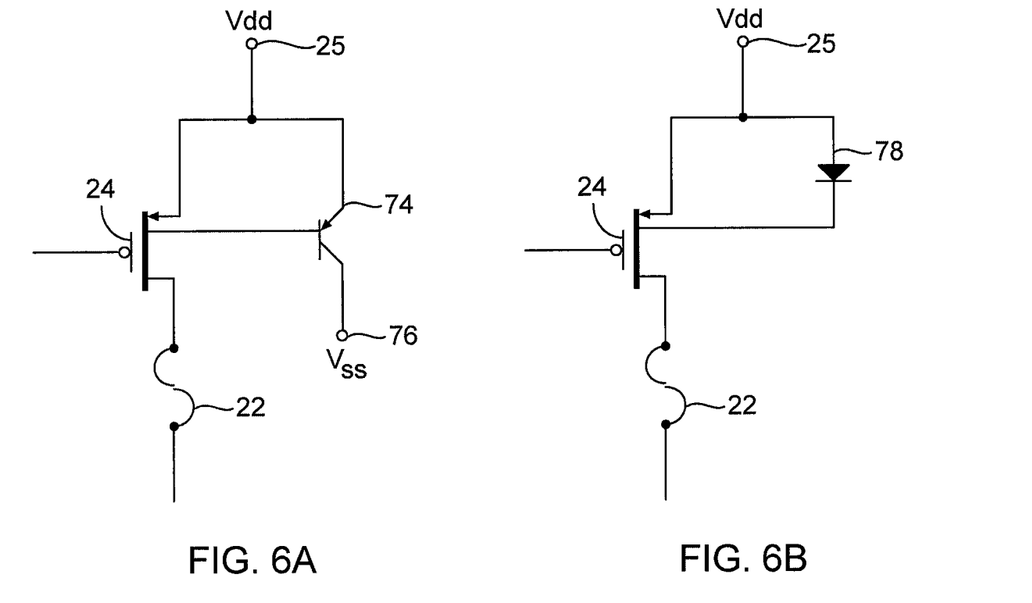
FIGS. 6A-6C depict some additional embodiments of a fuse driver circuit.
Figure 6C:
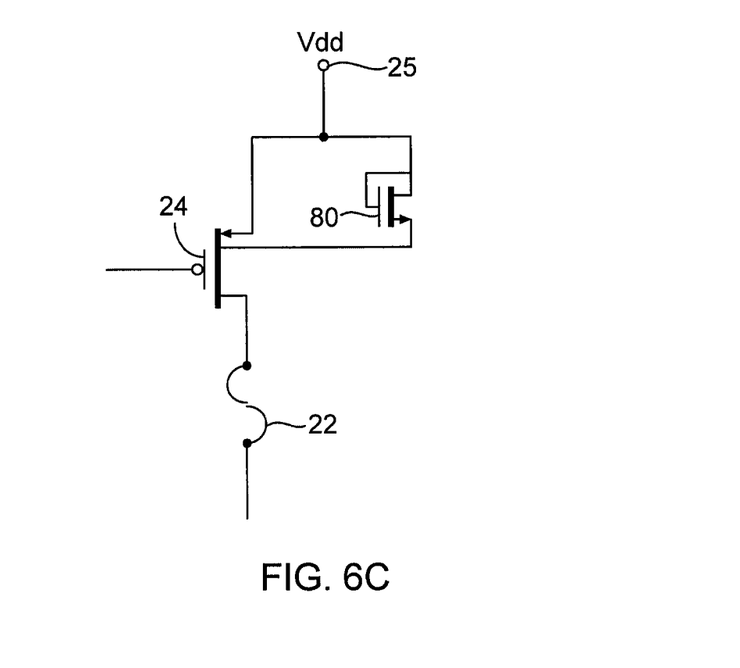

In some embodiments, a diode 26 can be coupled to the well of the pull-up PMOS transistor 24 in the circuitry, as shown in FIG. 1, to prevent the P-N junction of the PMOS transistor 24 from forward biasing and thereafter and exhibiting a silicon controlled rectifier (SCR) response. The positive end of the diode 26 can be coupled to the power supply (Vdd) 25, and the negative end of the diode can be coupled to the well of the PMOS transistor 24. This diode 26 can be any diode known in the art, including a Schottky diode 26, a P-N diode of a PNP-BJT 74, or an NMOS transistor 80 containing a P-N diode, as depicted in the configurations of FIGS. 6A-6C. When the well of the PMOS transistor 24 has a lower voltage than the source of the PMOS transistor, such as would occur in an undervoltage event, the diode 26 may prevent a SCR response in the PMOS transistor 24. For instance, the diode 26 prevents the base-emitter junction of the PMOS transistor 24 from forward biasing and thereafter exhibiting a SCR response. The diode 26, thus, restricts current flowing through the well of the PMOS transistor 24 to the fuse 22 in undervoltage events. Thus, in some embodiments, the diode 26 prevents current flow to the fuse 22 in undervoltage events by preventing current flow through the pull-up PMOS transistor 24 when the supply voltage (Vdd) 25 is below ground. Accordingly, in some embodiments, the diode 26 limits current flow through the pull-up PMOS transistor 24 up to its breaking point.

Figure 2:
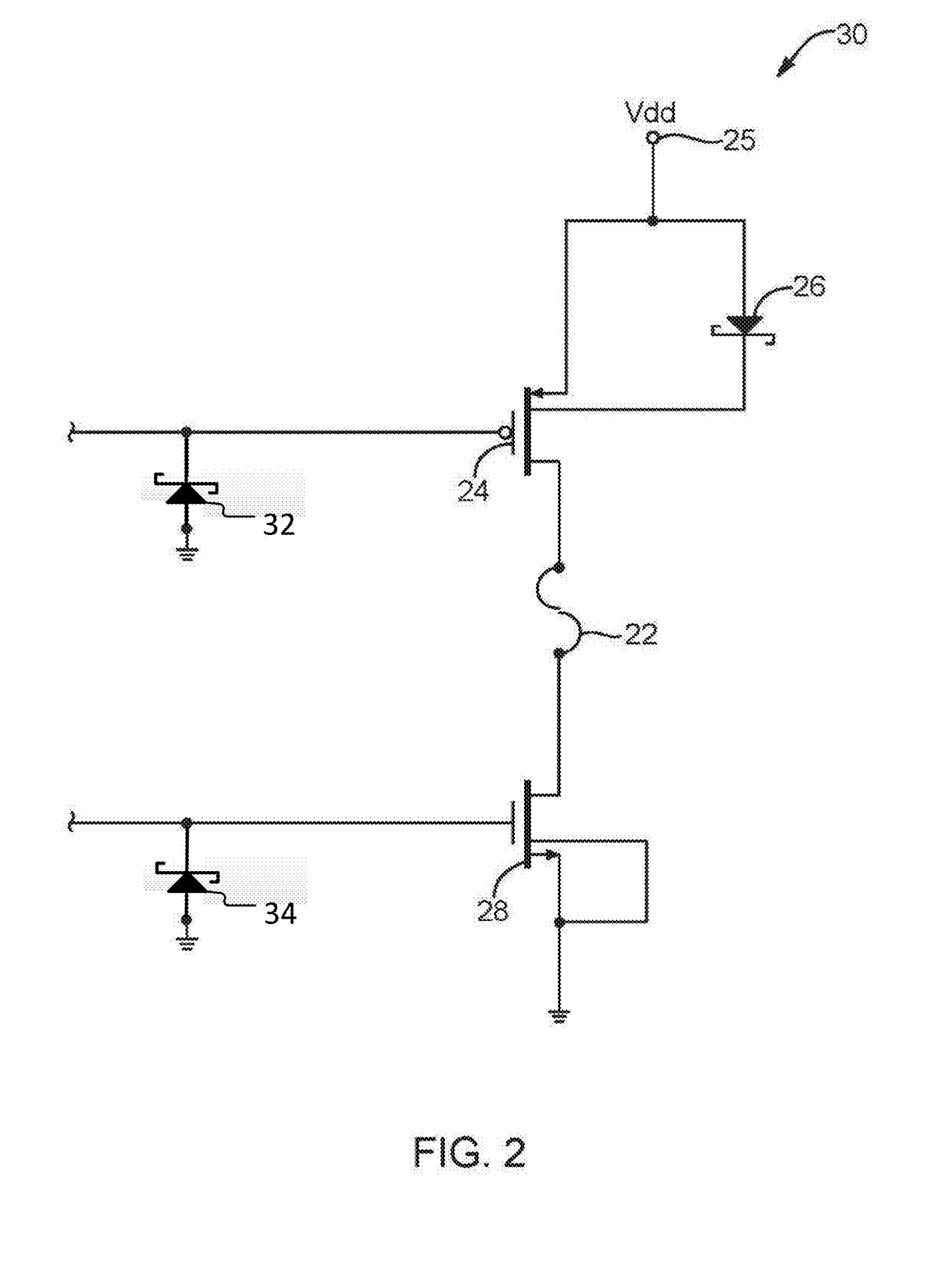
FIG. 2 depicts some additional embodiments of a fuse driver circuit.

As illustrated, in some embodiments of a fuse driver circuit 30, as depicted in FIG. 2, the gate of the PMOS 24 transistor is coupled to the negative end of a diode 32, and the positive end of the diode 32 is coupled to ground. In some embodiments, the gate of the NMOS 28 transistor is coupled to the negative end of a diode 34 and the positive end of the diode 34 is coupled to ground. In some embodiments, these diodes 32 and 34 ensure that the PMOS 24 and NMOS 28 transistors stay at ground in the event that the power source (Vdd) drops below ground. Thus, in some embodiments, these diodes 32 and 34 provide additional robustness to the fuse circuit 30.

Because fuses generally protect other circuitry, in some instances, the circuitry may be designed to have a predetermined threshold current level that purposefully blows the fuse 22 rather than transmit the current to the other circuitry. To ensure that the fuse 22 will provide the desired protection to other circuitry, it can be useful to test the functionality of the fuse driver circuit. This testing may make sure that the pull-up transistor 24 and pull-down transistor 28 function properly to, among other functions, protect the fuse 22 from current levels that will not harm other circuitry while also allowing current to pass to the fuse 22 when that current will harm other circuitry.

Figure 3:
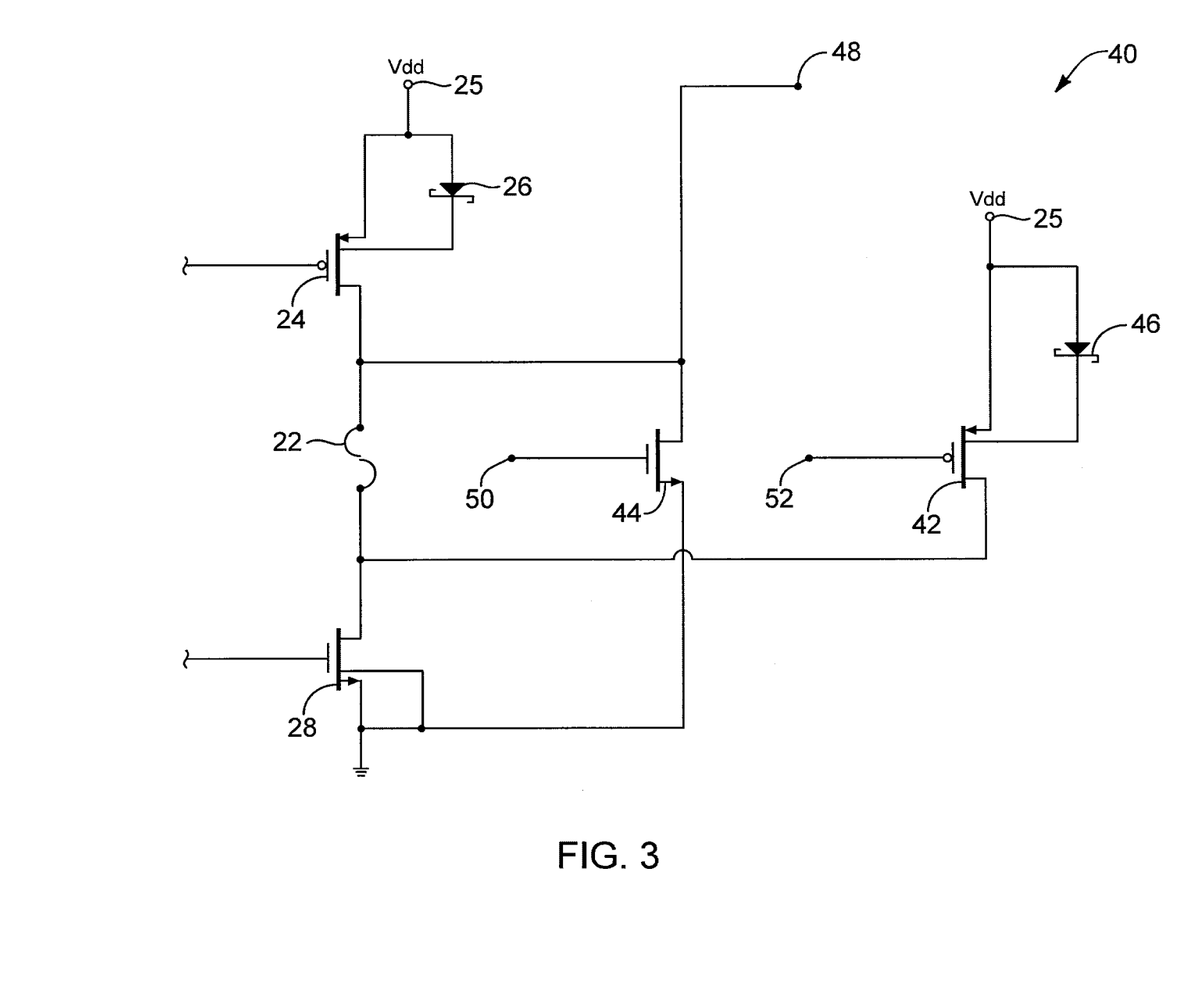
FIG. 3 depicts some embodiments of a fuse driver circuit having testing circuitry.

FIG. 3 illustrates, according to some embodiments, a fuse driver circuit 40 with testing components that facilitates testing of the pull-up and pull-down transistors 24 and 28. As illustrated in FIG. 3, the drain of an auxiliary NMOS transistor 44 can be coupled to the positive end of the fuse 22. The source of the auxiliary NMOS transistor 44 can also be coupled to ground. A first sense point 48 can be coupled to the positive end of the fuse 22 and a second sense point can be coupled to the gate of an auxiliary NMOS transistor 44. Generally, sense points comprise electrical connections between a point within the circuit to an external location that facilitates testing and monitoring activities.

To test the fuse driver circuit 40, voltages can be applied to the sense points or monitored at the sense points in order to turn on and off the transistors of the fuse driver circuit 40, thereby testing the circuit under these voltage conditions. For instance, to test the pull-up PMOS transistor 24, the pull-up PMOS transistor 24 is turned on and the pull-down NMOS transistor 28 is turned off. The auxiliary NMOS transistor 44 is turned on, which draws current through the pull-up PMOS transistor 24 and through the auxiliary NMOS transistor 44. By monitoring the current response to the pull-up PMOS transistor 24, it can be determined whether the pull-up PMOS transistor 24 is capable of providing sufficient current to the fuse 22 to blow the fuse in an ESD event.

As further illustrated in FIG. 3, to provide further testing circuitry, in some embodiments, the drain of another (second) auxiliary PMOS transistor 42 is coupled to the negative end of the fuse 22, and the source of this auxiliary PMOS transistor 42 is coupled to a power supply voltage (Vdd) 25. In some embodiments, a third sense point 52 is coupled to the gate of the auxiliary PMOS transistor 42. To test the pull-down NMOS transistor 28, the pull-up PMOS transistor 24 is turned off and the pull-down NMOS transistor 28 is turned on. The auxiliary PMOS transistor 44 is also turned on, which draws current through the pull-down NMOS transistor 28. In some embodiments, by monitoring the current response to the pull-down NMOS transistor 28 and its resistance, it can be determined whether the pull-down NMOS transistor 28 is capable of providing sufficient current to the fuse 22 to blow the fuse in an ESD event.

From the forgoing, it will be seen that the fuse driver circuits of FIGS. 1-2 can, in some embodiments, provide a robust protection to the fuse 22, except in instances where it is necessary to blow the fuse 22. FIGS. 4-6C, which will be described at this point, provide alternative embodiments of fuse driver circuits that also provide robust protection to the fuse 22.

Figure 4:
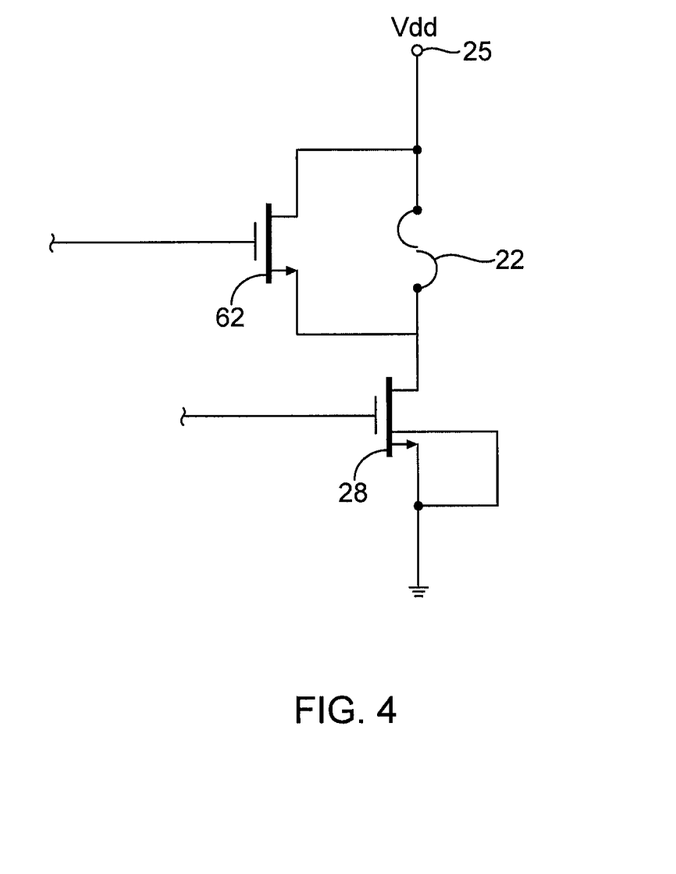
FIG. 4 depicts some embodiments of a fuse driver circuit.

FIG. 4 illustrates an embodiment of a fuse driver circuit 60 that includes a NMOS transistor 62 in parallel with the fuse 22. Similar to the circuit 20 of FIG. 1, the fuse driver circuit 60 of FIG. 4 includes a fuse 22 and a pull-down NMOS transistor 28 coupled to the fuse 22. The drain of the pull-down NMOS transistor 28 can be coupled to the negative end of the fuse 22. Additionally, the drain of a second NMOS transistor 62 can be coupled to the positive end of the fuse 22. The source of the second NMOS transistor 62 can then be coupled to the negative end of the fuse 22. In some embodiments, similar to the pull-up PMOS transistor described above with reference to FIGS. 1-3, the second NMOS transistor 62, in combination with the pull-down NMOS transistor 28, can also provide overvoltage and undervoltage protection to the fuse 22 by controlling the current levels that pass through the fuse 22. The second NMOS transistor 62 can be included in the fuse circuit 60 instead of, or in addition to, the pull-up PMOS transistor 24.

Figure 5:
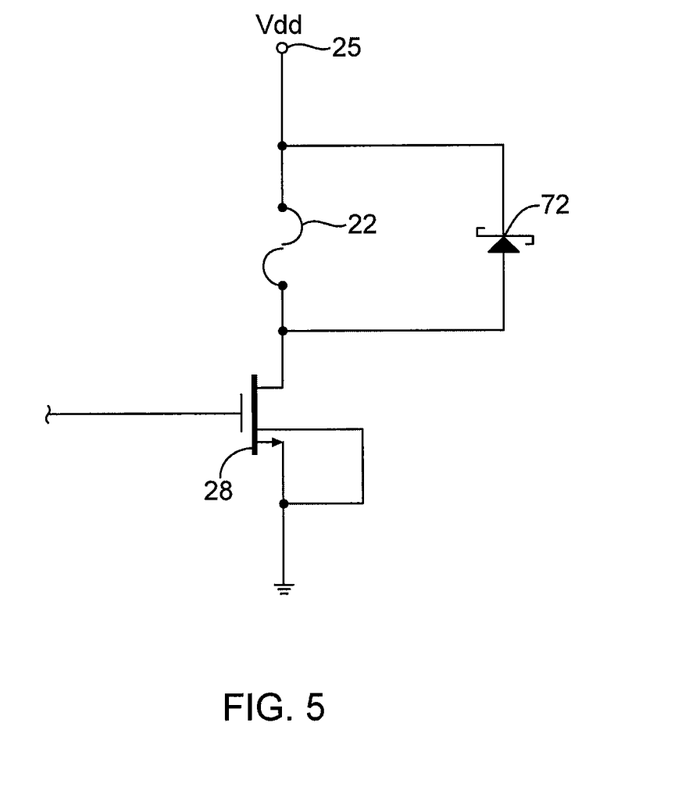
FIG. 5 depicts some embodiments of a fuse driver circuit.

FIG. 5 illustrates another embodiment of a fuse driver circuit, according to some embodiments. As illustrated, the fuse driver circuit 70 includes a fuse 22 and a diode 72 in parallel. The negative end of the diode is coupled to the positive end of the fuse 22 and the positive end of the diode 72 can be coupled to the negative end of the fuse 22. The diode 72 can be any known diode, including a Schottky diode or a P-N diode. In some embodiments, the diode 72 provides protection to the fuse 22 by limiting the current that passes from the negative end to the positive end of the fuse 22. Accordingly, only current drawn through the fuse from the pull-down NMOS transistor 28 will blow the fuse, as described above with reference to FIGS. 1-3. The diode 72 can be included in the fuse circuit 70 instead of, or an addition to, the pull-up PMOS transistor 24, described above with reference to FIGS. 1-3.

FIGS. 6A-6C illustrates embodiments of various components that could replace the diode 26 of the fuse driver circuit 20 illustrated in FIG. 1. In some embodiments, this diode 26 is replaced with a PNP-BJT 74 as illustrated in FIG. 6A. The base of the BJT 74 is coupled to the well of the PMOS transistor 24 while the emitter of the BJT is coupled to a power supply (Vdd) 25. In some embodiments, the collector is coupled to another power supply (Vss). The BJT, thus configured, can function similar to a P-N diode. In other embodiments, this component is replaced with a P-N diode 78, as illustrated in FIG. 6B. In yet other embodiments, this component is replaced with a NMOS transistor 80, as illustrated in FIG. 6C. As illustrated, the drain and the gate of the NMOS are coupled to a power supply (Vdd) 25, while the source is coupled to the well of the PMOS transistor 24. This NMOS component can likewise function like a P-N diode and replace diode 26 of FIG. 1.

It is understood that while specific dopants are names for the n-type and p-type dopants, any other known n-type and p-type dopants (or combination of such dopants) can be used in the semiconductor devices. As well, although the devices of the invention are described with reference to a particular type of conductivity (P or N), the devices can be configured with a combination of the same type of dopant or can be configured with the opposite type of conductivity (N or P, respectively) by appropriate modifications.

In addition to any previously indicated modification, numerous other variations and alternative arrangements may be devised by those skilled in the art without departing from the spirit and scope of this description, and appended claims are intended to cover such modifications and arrangements. Thus, while the information has been described above with particularity and detail in connection with what is presently deemed to be the most practical and preferred aspects, it will be apparent to those of ordinary skill in the art that numerous modifications, including, but not limited to, form, function, manner of operation and use may be made without departing from the principles and concepts set forth herein. Also, as used herein, examples are meant to be illustrative only and should not be construed to be limiting in any manner.

The invention claimed is:

1. A fuse driver circuit, comprising:
a fuse;
an NMOS transistor having a drain of the NMOS transistor coupled to a negative end of the fuse and a source of the NMOS transistor coupled to ground;
a PMOS transistor having a drain of the PMOS transistor coupled continuously to a positive end of the fuse and a source of the PMOS transistor coupled to a power supply (Vdd); and
a first diode having the positive end of the diode coupled to the source of the PMOS transistor and the negative end of the diode coupled to a well of the PMOS transistor,
a second diode having a positive end coupled to ground and a negative end coupled to a gate of the PMOS transistor;
wherein the NMOS transistor is configured to:
when the power supply (Vdd) is greater than ground, break down and conduct current sufficient to blow the fuse only if the power supply (Vdd) exceeds a threshold voltage, and
when the power supply (Vdd) is less than ground, become forward biased and conduct a limited level of current that is insufficient to blow the fuse; and
wherein the gate of the PMOS transistor is configured to be set and remain at ground even when the power supply (Vdd) becomes less than ground.

2. The fuse driver circuit of claim 1, wherein the first diode is selected from a group consisting of a Schottky diode, a P-N diode, a PNP-BJT, and a NMOS transistor.

3. The fuse driver circuit of claim 1, further comprising a third diode having a positive end coupled to ground and a negative end coupled to a gate of the NMOS transistor.

4. The fuse driver circuit of claim 1, wherein the NMOS transistor is a first NMOS transistor, and the fuse driver circuit further comprising a second NMOS transistor disposed in parallel with the first NMOS transistor and the fuse, wherein the drain of the second NMOS transistor is coupled to the positive end of the fuse, a source of the second NMOS transistor is coupled to ground, the positive end of the fuse is coupled to a first sense point, and the gate of the second NMOS transistor is coupled to a second sense point.

5. The fuse driver circuit of claim 1, wherein the PMOS transistor is a first PMOS transistor, and the fuse driver circuit further comprising a second PMOS transistor having a drain of the second PMOS transistor coupled to the negative end of the fuse, a source of the second PMOS transistor coupled to the power supply (Vdd), the positive end of the fuse coupled to a first sense point, and a gate of the second PMOS transistor coupled to a third sense point.

6. The fuse driver circuit of claim 1, wherein the fuse is a polyfuse.

7. The fuse driver circuit of claim 1, further comprising a second NMOS transistor having the drain of the second NMOS transistor coupled to a positive end of the fuse and a source of the second NMOS transistor coupled to the negative end of the fuse.

8. The fuse driver circuit of claim 1, wherein the PMOS transistor is configured to:
when the power supply (Vdd) is greater than ground, break down and conduct current sufficient to blow the fuse only if the power supply (Vdd) exceeds a threshold voltage, and
when the power supply (Vdd) is less than ground, become forward biased and conduct a limited level of current that is insufficient to blow the fuse.

9. The fuse driver circuit of claim 1, wherein the threshold voltage is greater than ten volts.

10. The fuse driver circuit of claim 1, wherein the drain of the PMOS transistor is coupled directly to the positive end of the fuse.

11. The fuse driver circuit of claim 10, wherein the drain of the NMOS transistor is coupled directly to the negative end of the fuse.

12. The fuse driver circuit of claim 11, wherein:
the source of the PMOS transistor is coupled directly to the power supply (Vdd), and
the source of the NMOS transistor is coupled directly to ground.

13. The fuse driver circuit of claim 1, wherein:
the positive end of the first diode is coupled directly to the source of the PMOS transistor, and
the negative end of the diode is coupled directly to the well of the PMOS transistor.

14. The fuse driver circuit of claim 1, wherein the negative end of the second diode is coupled directly to the gate of the PMOS transistor.

15. The fuse driver circuit of claim 14, wherein the positive end of the second diode is coupled directly to ground.

16. The fuse driver circuit of claim 14, wherein the negative end of the third diode is coupled directly to the gate of the NMOS transistor.

17. The fuse driver circuit of claim 16, wherein the positive end of the third diode is coupled directly to ground.

18. The fuse driver circuit of claim 1, wherein the first diode is configured to impede flow of current from the well of the PMOS transistor to Vdd when Vdd is less than ground.

19. The fuse driver circuit of claim 1, wherein a well of the NMOS transistor is coupled directly to ground.

20. A fuse driver circuit, comprising:
a fuse comprising a positive end continuously coupled to a power supply (Vdd);
a first NMOS transistor having a drain of the first NMOS transistor coupled to a negative end of the fuse and a source of the first NMOS transistor coupled to ground, wherein the first NMOS transistor is configured to:
when the power supply (Vdd) is greater than ground, break down and conduct current sufficient to blow the fuse only if the power supply (Vdd) exceeds a threshold voltage, and
when the power supply (Vdd) is less than ground, become forward biased and conduct a limited level of current that is insufficient to blow the fuse; and
a second NMOS transistor having a drain of the second NMOS transistor coupled to the positive end of the fuse and a source of the second NMOS transistor coupled to the negative end of the fuse, wherein the second NMOS transistor is disposed in parallel with the fuse;
wherein the drain of the second NMOS transistor is coupled directly to the positive end of the fuse, the source of the second NMOS transistor is coupled directly to the negative end of the fuse, and the drain of the first NMOS transistor is coupled directly to the negative end of the fuse.

21. The fuse driver circuit of claim 20, wherein the fuse is a polyfuse.

* * * * *